United States Patent [19]

Angelo et al.

[11] 4,238,528
[45] Dec. 9, 1980

[54] POLYIMIDE COATING PROCESS AND MATERIAL

[75] Inventors: Raymond W. Angelo; Richard M. Poliak, both of Endwell; John R. Susko, Binghampton, all of N.Y.

[73] Assignee: International Business Machines Corporation, Armonk, N.Y.

[21] Appl. No.: 81,298

[22] Filed: Oct. 2, 1979

Related U.S. Application Data

[63] Continuation-in-part of Ser. No. 919,356, Jun. 26, 1978, abandoned.

[51] Int. Cl.³ .................. H05K 3/28; H01L 21/56
[52] U.S. Cl. .................................. 427/96; 29/588; 29/841; 29/855; 260/308 R; 260/33.8 R; 427/82; 427/385.5; 528/350; 528/353
[58] Field of Search ............... 29/627, 588; 260/30.8 R; 427/96, 385 R, 82; 528/350, 353; 525/928, 929

[56] References Cited

U.S. PATENT DOCUMENTS

| | | | |
|---|---|---|---|
| 2,803,656 | 8/1957 | Ahlbrecht | 260/356 |
| 3,356,759 | 12/1967 | Gerow | 525/928 |
| 3,356,760 | 12/1967 | Matray | 525/928 |
| 3,440,204 | 4/1969 | Reinhard | 528/353 |
| 3,536,647 | 10/1970 | Battista | 260/29.2 |
| 3,597,269 | 8/1971 | Chang | 427/88 |
| 3,615,913 | 10/1971 | Shaw | 427/82 |
| 3,682,698 | 8/1972 | Palmer et al. | 427/82 |
| 3,686,139 | 8/1972 | Lubin | 252/511 |
| 3,714,709 | 2/1973 | Liederbach | 427/96 |
| 3,734,791 | 5/1973 | Poliak | 148/23 |
| 3,779,768 | 12/1973 | Cope | 96/75 |
| 3,841,957 | 10/1974 | Sprengling | 427/96 |
| 3,931,454 | 1/1976 | Sprengling | 427/96 |
| 3,978,578 | 9/1976 | Murphy | 427/82 |
| 4,001,870 | 1/1977 | Saiki | 427/82 |
| 4,017,886 | 4/1977 | Tomono et al. | 528/353 |
| 4,064,289 | 12/1977 | Yokoyama et al. | 427/82 |

*Primary Examiner*—John D. Smith
*Attorney, Agent, or Firm*—David M. Bunnell

[57] ABSTRACT

A protective layer composition, suitable for protecting metal electrodes on components and other microelectronic circuitry, comprises an organic thermoplastic polymeric material, an organic solvent or solvents, and a non-ionic fluorocarbon surfactant as a wetting-/leveling/flow control agent. A typical formulation comprises an aromatic polymer which cures to form a polyamide-imide polymer, an organic solvent or a mixture of orangic solvents and a non-ionic fluorocarbon surfactant.

7 Claims, 2 Drawing Figures

POLYIMIDE COATING PROCESS AND MATERIAL

CROSS REFERENCE TO RELATED APPLICATION

This Application is a Continuation-in-Part of Application Ser. No. 919,356 filed on June 26, 1978 now abandoned.

BACKGROUND OF THE INVENTION

The present invention relates generally to protective coatings and specifically to an imide polymer containing coating material which includes an non-ionic flurocarbon surfactant to more effectively hermetically top-seal electronic circuitry, components, and integrated circuit chip devices from hostile environments as well as provide mechanical stress relief to extend functional electronic device package life.

In the manufacturing of integrated circuit modules, it is customary to seal the metal circuitry and the connections between the substrate and the integrated circuit chip devices with a polymer layer. Typically, a liquid top seal coating is dispensed over the devices and then cured to protect the critical joints and pad areas against corrosion/migration, atmospheric contaminations, and moisture permeation. The coatings also mechanically enhance the chip joint reliability while serving as dielectric insulators. The top seal coating can be applied by spin, spray, dip, or dispense techniques. The method of application is optional dependent upon product requirements.

Polyimide coatings have been used in the past to seal electronic components and circuitry. Prior to the present invention, valid concerns existed in the integrity of the coating coverage of joints which are located underneath the chip devices. The need existed for a more uniform protective coating over all pad areas.

In addition, the increasing complexity of chip designs, which may contain joints in the middle of the chips as well as along the periphery of the chips, requires further improvement in topseal wetting to penetrate between the chips and substrates and insure coverage of the internal pads and solder joints.

Accordingly, it is an objective of the present invention to significantly reduce the surface tension of top layer protective coatings. This greatly facilitates the ability of the coating to uniformly wet all joints and pad areas when, for example, coating modules where the integrated circuit chips are joined to the substrate as described in U.S. Pat. No. 3,429,040. The coatings penetrate under those chips having design configurations that contain internal joints/pads that, like perimeter joints/pads, also require coating coverage.

BRIEF SUMMARY OF THE INVENTION

In accordance with this invention there is provided a process for forming a seal coating on electronic circuitry comprising:

Applying to said circuitry a coating material which includes:

An aromatic polymer which, when cured, forms a polyimide,
an organic solvent for said polymer,
a non-ionic fluorocarbon surfactant, and
curing the material to form a polyimide seal coating on said circuitry.

A composition is provided which includes:

An aromatic polymer which, when cured, forms a polyimide,
an organic solvent for said polymer, and
a non-ionic fluorocarbon surfactant.

Optionally, adhesion promotors such as silanes can be added to the compositions. The term polyimide as used herein includes both polyimide and polyamide-imide polymers.

DETAILED DESCRIPTION

The present invention offers the advantage of consistently providing a chip coating which is uniform in film thickness and free of pinholes, voids and blisters.

Surface conditions, circuit metallurgy, and complex pad configurations require improved wetting of the top-seal protective coating to insure good film coverage. Pinholes, voids, and blisters pose reliability problems due to site corrosion and protrusion problems when using low tempeature solder alloys at the solder joints.

Incomplete coverage or lack of coverage of coatings results in a shift in thermal stresses affecting the uncoated joints/pads creating stress cracking at and early failure of the uncovered joints.

Figure 1:
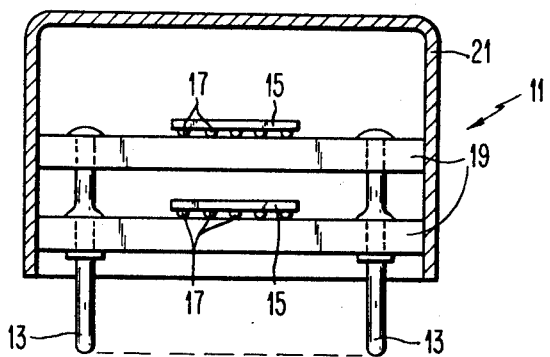
FIG. 1 is an elevational view, partly in section, showing a stacked module.
Figure 2:
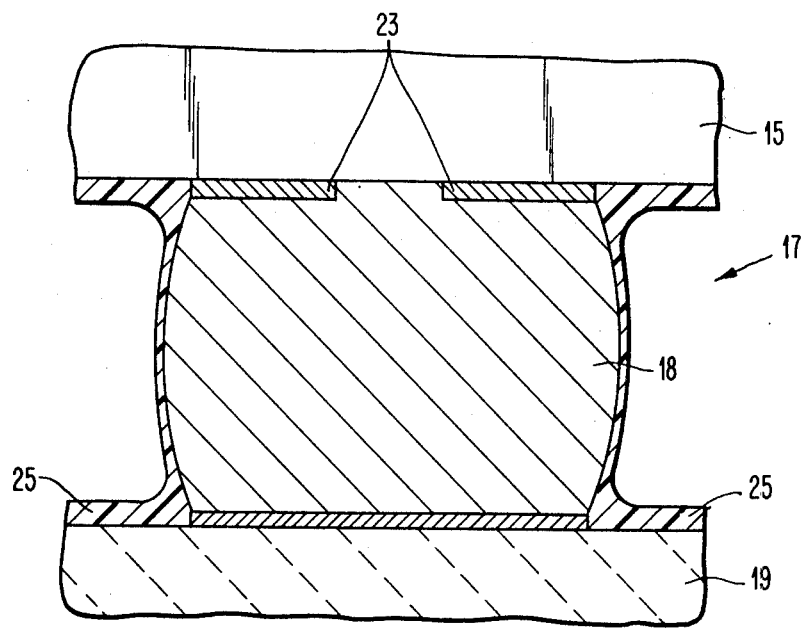
FIG. 2 is a schematic cross-sectional view of a solder joint between a chip and module with a polymer topseal coating.

When dispensing protective coatings into stacked modules, the advantage of improved wetting to insure coverage is even more important. As in the case of planar substrates, complete coverage of all chip joints/pads is needed to ensure adequate protection so as to extend device life. Besides providing mechanical enhancement of the joints the presence of a uniform protective coating layer also serves to improve the heat transfer characteristics. The modules coated by the process of the invention exhibit a cooler area between the chip and substrate so that the chip remains cooler during operation. FIG. 1 shows a stacked module 11 having connecting pins 13, and chips 15 mounted by joints 17 on substrates 19 and a metal cap 21. FIG. 2 is a schematic of an individual solder joint/pad 17, with solder 18 connecting pads 23 on chip 15 and pad 24 on substrate 19, showing the protective layer 25 coverage required. The typical distance from the substrate to the chip is about 0.004 to 0.005 inch.

The polyimide and polyamide-imide resins which are useful in the practice of the invention are a class of polymers finding use in electronic packaging as protective coatings due to their excellent chemical resistance and high temperature stability properties. In addition, this group of thermoplastics also exhibits good electrical as well as mechanical atributes.

The polyamide-imide polymers are prepared from anhydrides and diamines, for example, trimellitic anhydride and P,P'-diaminodiphenylmethane.

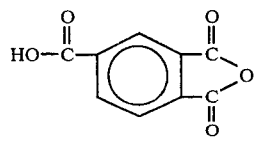

TRIMELLITIC ANHYDRIDE

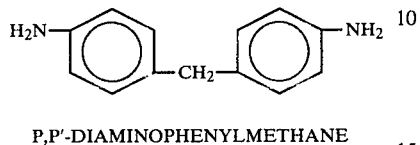

P,P'-DIAMINOPHENYLMETHANE

This combination gives a polyamic acid-amide polymer which cyclicizes or imidizes on curing, such as by heating, to form a cured polyamide-imide.

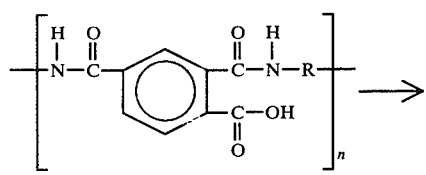

POLYAMIC ACID-AMIDE

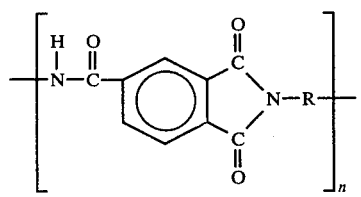

POLYAMIDE-IMIDE

The polyimides are the reaction product of dianhydrides and diamines, for example, benzophenone tetracarboxylic acid anhydride and oxydianiline (4,4'-diaminodiphenylether).

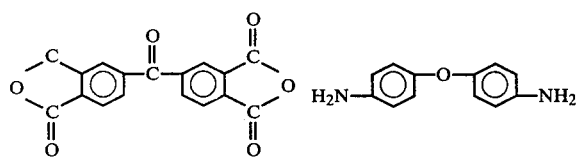

| BENZOPHENONE | OXYDIANILINE |
| TETRACAR- | 4,4'-DIAMINO- |
| BOXYLIC ACID | DIPHENYL ETHER |
| ANHYDRIDE | |

The following ilustrates the condensation reaction of pyromellitic dianhydride and an aromatic diamine.

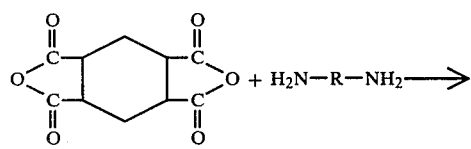

| PYROMELLITIC | AROMATIC |
| DIANHYDRIDE | DIAMINE |

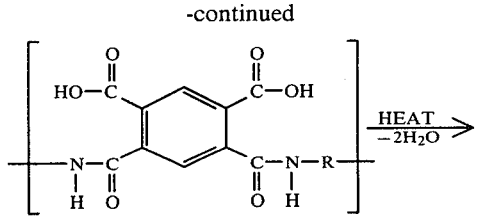

POLYAMIC ACID INTERMEDIATE

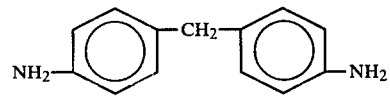

CURED AROMATIC POLYMIDE

Other materials such as 4,4'-diamino-diphenylmethane may be added to obtain the desired properties required for a specific application.

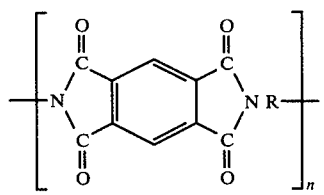

The polymers are coated onto the circuitry from a solvent solution. Preferred solutions would include about 4 to 12 weight percent of polymer solids dissolved in an organic solvent or a mixture of organic solvents.

Table I lists examples of organic solvents suitable for use as vehicles for the protective coating formulations of the invention.

TABLE I

| SOLVENT | SOL* PARA | M.P. | B.P. | FL.P. |
| --- | --- | --- | --- | --- |
| Dimethylacetamide | 10.8M | −20 | 166 | 70 |
| Hallcomid M8-10 (N, N-dimethyl caprylamide-capramide M.wt. 171-199) | | −21 | 115–170** | 118 |
| N-methyl pyrrolidone | 11.3M | −24 | 202 | 95 |
| 1-formyl piperidine | 11.5M | −31 | 222 | |
| Dimethylsulfoxide | 12.0M | 18 | 189 | 95 |
| Tetramethylurea | | −1 | 177 | |
| Tetramethylenesulfone | 13.4M | 27 | 285 | |

*Solubility parameters and strength of hydrogen bonding
**at 3MM Hg

In addition to the above organic solvents, mixtures of solvents or a combination solvent/diluent are also applicable. Polyamic acid intermediates for forming polyimides may be dissolved, for example, into the following combinations of solvent/diluent:

1/1 blend of N-methyl pyrrolidone (NMP)/Acetone
    NMP/Cellosolve*
    NMP/Xylene
    NMP/toluene
(2-ethoxyethanol) Cellosolve*/acetone
*Trademark of Union Carbide Corporation For polyamide-imide forming polymers, Dimethyl acetamide, Dimethyl formamide, Dimethyl sulfoxide, and N-methyl pyrrolidone are known solvents. The solubility range, by weight, of diluent concentrations for the polymers as known in the art, include:

40–50%: Aromatics (toluene, xylene, cyclohexanone)

40–50%: Esters (ethyl acetate, methyl propionate)
50–60%: Ketones (acetone, methyl ethyl ketone, 80% cyclohexanone)
30–40%: High boiling amides, aliphatic amides containing 1–4 carbon atoms (acetamide, propionamide, butyramide)
40–50% Cellosolves* (2-ethoxyethanol)

*Trademark of Union Carbide Corporation

The preferred polyimides and polyamide-imides useful in the present invention have molecular weights from about 13,000 to about 60,000. These materials are suitable for purposes of the present invention since they possess high temperature stability in coating formulas with good electrical properties at temperatures <200° C. after imidization.

To this mixture, a non-ionic fluorinated alkylester surfactant is added to improve wetting, leveling characteristics, and coverage of the protective film coating. Preferred fluorocarbon surfactants are non-ionic types that will reduce the surface tension of the polyimide and polyamide-imide precursors to less than 25 dynes/cm at 25° C. for a 0.1% weight percent solution.

Non-ionic fluorinated surfactants have been found to be unique in producing uniform coatings and in avoiding the introduction of materials into the coating that can cause corrosion of the metallurgy. Non-fluorinated hydrocarbon surfactants have not been found effective in producing an acceptable coating process.

In the fluorocarbon chain of the non-ionic surfactants useful in the present invention, which can be cyclic or non-cyclic, it is necessary that the hydrogens on the carbon structure be replaced by fluorine to such a degree that the fluorocarbon chain or "tail" portion of the liquid surfactant be essentially a fluorocarbon. This does not imply complete hydrogen replacement in all instances, though such will, for ease of commercial availability, generally be the case. Liquid non-ionic fluorinated alkylester surfactants of the present invention contain the recurrent unit (CF$_2$) and can generally be represented by the formula:

$$R_f(CH_2)_m\overset{O}{\overset{\|}{C}}OR'$$

Where R$_f$ is a perfluoroalkyl group having from 3 to 12 carbon atoms and m is integer from 2 to 12, and R' is a low molecular weight (for example about 15,000 centipoises at 25° C.), polyoxyethlene, polyoxypropylene or polyoxyethylene-polyoxypropylene copolymer group.

These are a class of fluorocarbon surfactants that will reduce the surface tension of the amide-imide or imide polymer solutions to less than 25 dynes/cm, for example from 39.4 dynes/cm down to 24.2 dynes/cm so that complete and uniform topseal coatings can be achieved.

Another non-ionic type of fluorocarbon surfactant useful in the invention are N-polyoxyethlene substituted perfluorosulfonamides of the formula:

$$C_8F_{17}SO_2-\underset{\underset{R}{|}}{N}-(C_2H_3O)_nH$$

in which R is a lower alkyl group having from 1 to 6 carbon atoms such as methyl, ethyl propyl, butyl, etc. and n is an integer from 2–30.

Also useful in the practice of the invention are the fluorocarbon compounds of the class consisting of N-alkanol perfluoroalkanesolfonamides having the formula:

$$R_fSO_2N(R')RCH_2OH$$

where R$_f$ is a perfluoroalkyl group containing 4 to 12 carbon atoms, R is an alkylene bridging group containing 1 to 12 carbon atoms, and R' is a hydrogen atom or an alkyl group containing 1 to 6 carbon atoms; and the corresponding esters. An example of these compounds would be N-propyl, N-ethanol perfloro-octanesulfonamide having the formula:

$$C_8F_{17}SO_2N(C_3H_9)CH_2CH_2OH$$

Mixtures of the above surfactants can also be used. A silane or a mixture of silanes may be used to promote bond adhesion between the ceramic substrate, metallic circuitry and the top seal coating. Silane adhesion promoters having a perferred specific gravity of 0.94 to 1.06 g/l at 25° C. can be added to the compositions. Useful silanes include, for example, gamma-aminopropyltriethoxysilane; beta-3,4(epoxycyclohexyl) ethyltrimethoxysilane; and gamma-glycidoxy-propyltrimethoxysilane. The silanes are optionally used in amounts up to about 1% by weight of the total mixture.

Generally, the protective coating formulations of the present invention comprise approximately by weight:
2–20%: Polymer (Polyamic acid precursor of polyamide-imide or polyimides)
0.001–1%: Non-ionic fluorocarbon surfactant(s)
0.1–1%: Silane additive or a mixture of silane additives with the balance (80–98%) being an organic solvent or a mixture of organic solvents and diluents.

Preferred protective coating formulations of the present invention would be:
4–8%: Polymer
92–96%: Organic solvent from the following group or a mixture of solvents including dimethylacetamide, N-methylpyrrolidone, 1-formyl piperderic, dimethylsulfoxide, tetramethyl urea and tetramethylsulfone
0.001–0.1%: Non-ionic fluorocarbons surfactant
0.1–1.0%: Silane additive (optional)

As described above, diluents can also be included in combination with the above solvents and are useful as bisolvents to a degree of solubility as known in the art.

Specific formulas are:

|  | Percent by Weight | | | |
| --- | --- | --- | --- | --- |
|  | (1) | (2) | (3) | (4) |
| Polyamide-imide percursor powder (AI-10 polymer of Amoco) | 7.30 | 4.46 | 7.47 | 4.50 |
| Dimethylacetamide | 92.00 | 95.00 | 92.00 | 95.00 |
| Silanes; 1:1 ratio of Beta, (3,4-epoxycyclohexyl)ethyltrimethoxy-silane/2-aminopropyltriethyxy-silane | 0.65 | 0.44 | 0.46 | 0.45 |
| Non-ionic alkyl-ester fluorocarbon surfactant (FC430 brand surfactant of 3M Company) | 0.05 | 0.10 | 0.07 | 0.05 |
|  | 100 | 100 | 100 | 100 |

Formulas 3 and 4 were used to measure the effect of adding the surfactant. Both showed a reduced surface tension of 24.1 dynes/cm from the formula (without surfactant) of 39.4 dynes/cm.

A change in the formula by replacing the polyamide-imide forming polymer with a polyimide forming polymer produced a coating mixture (5) having a similar surface tension reduction applicable to this invention and necessary to wetting:

|  | Percent (5) |
|---|---|
| Polyimide percursor (solids-powder) | 4.50 |
| N-methyl pyrollidone | 95.00 |
| Silanes 1:1 ratio as in formulas 1–4 | 0.45 |
| Non-ionic alkyl-ester fluorocarbon surfactant (F-430 brand surfactant of 3M Co. | 0.05 |

Other non-ionic types of fluorinated surfactants such as the N-polyoxyethylene substituted perfluorosulfonamides and compounds of the class consisting of N-alkanol perfluoroalkanesulfonamides can be substituted in the above formulas.

The fluorinated surfactants used in this invention specifically are non-ionic rather than cationic, anionic, or amphoteric. This is to deliberately avoid using ionic materials in the protective coatings.

Significant differences are apparent in comparing fluorinated surfactants with hydrogen surfactant groups. The fluorocarbons promote unusually low cohesive surface tension and excellent solubility parameters which were not obtained when using non-ionic hydrocarbon surfactant types such as, for example, ethoxylated alkylphenols, ethoxylated aliphatic alcohols, ethoxylated sorbitols and other polyethylene adducts.

Hydrocarbon surfactants exhibit higher coefficients of friction as well as problems of miscibility (gel formations) corrosiveness, hygroscopicity low temperature decomposition and chemical interaction. Significantly larger quantities of hydrocarbons are also required adversely affecting final coating properties and their use did not result in satisfactory topseal coatings, particularly where internal connection pads are present in the structure.

In practice, a liquid protective coating of 4–8% polymer solids is dispensed in quantities of 15–150 mg over a chip device to coat the solder joints/pad areas. The quality of mix dispensed depends upon the chip size and number of chips present on the substrate. The exact thickness of protective film coating on the solder joint/pad is not critical so long as there is complete coverage. Preferrably, the film should be uniform and from $\approx 1$ mil to several angstroms thick (Ref. FIG. 2). Excessive filleting at the chip/substrate interface should be prevented to avoid excessive thermal stress at the chip interface resulting in cracks due to the different coefficients expansion of the polymer and the SnPb solder. The coatings are cured by heating in an oven per the following cure cycle, for example;

(a) 60 to 70 minutes at 110° C.±5° C.
(b) 60 to 70 minutes at 150° C.±5° C.
(c) 180 to 190 minutes at 170° C.±5° C.

It should be understood that the curing times and temperatures would be optimized for any particular mixture of polymers and solvents.

The use of the fluorinated surfactant enables the protective coatings to overcome surface contamination due to chip/substrate handling, processing and inefficient cleaning. With improved wetting, more uniform coverage is obtained especially in worst case conditions. The coating uniformity problems, which are encountered when non-surfactant containing polyimide layers are used, are alleviated by the process and coatings of the invention to an extent not previously achieved. The use of other surfactants has not been found to be effective in this respect and also may create other problems such as corrosion and gel formation.

Having thus described my invention, what I claim as new, and desire to secure by Letters Patent is:

1. A process for forming a seal coating on electronic circuitry comprising:
   applying to said circuitry a filler free coating material which includes:
   an aromatic polymer which, when cured, forms a polyimide,
   an organic solvent for said polymer, and
   a non-ionic fluorocarbon surfactant, and curing the material to form a polyimide seal coating on said circuitry.

2. The process of claim 1 wherein the aromatic polymer is selected from the group consisting of a polyamic acid and a polyamic acid-imide.

3. The process of claim 1 wherein the layer includes from about 0 to 1% by weight of a silane adhesion promoter.

4. The process of claim 1 wherein the coating material includes by weight: about 2 to 20% polymer, about 0.001 to 1.0% surfactant and about 80 to 90% solvent.

5. The process of claim 4 wherein the coating material includes by weight about 4 to 8% polymer, about 0.001 to 1% surfactant and about 92 to 96% solvent.

6. The process of claim 1 wherein the fluorocarbon surfactant is selected from the group consisting of non-ionic fluoroinated alkyl-ester surfactants represented by the formula:

$$R_f(CH_2)_m\overset{\overset{O}{\|}}{C}OR_3'$$

where $R_f$ is a perfluoroalkyl group having from 3 to 12 carbon atoms and m is integer from 2 to 12, and $R'$ is a low molecular weight polyoxethylene, a polyoxypropylene or a polyoxyethylenepolyoxypropylene copolymer group, N-polyoxyethylene substituted perfluorosulfonamides represented by the formula:

$$C_8F_{17}SO_2-\overset{\overset{R}{|}}{N}-(C_2H_4O)_nH$$

in which R is a lower alkyl group having from 1 to 6 carbon atoms such as methyl, ethyl propyl, butyl, etc. and n is an integer from 2–30, and N-alkanol perfluoroalkanesulfonamides represented by the formula:

$$R_fSO_2N(R')RCH_2OH$$

where $R_f$ is a perfluoroalkyl group containing 4 to 12 carbon atoms, R is an alkylene bridging group containing 1 to 12 carbon atoms, and $R'$ is a hydrogen atom or an alkyl group containing 1 to 6 carbon atoms; and the corresponding esters.

7. A process for forming an aromatic seal coating on metal conductor lines on the surface of a substrate and the solder joints and pads forming the connection between the substrate and an integrated circuit chip which is electrically bonded thereto comprising applying to said surface a filler free coating material which comprises 2 to 20% by weight of an aromatic polymer which, when cured, forms a polyimide about 80 to 90% by weight of an organic solvent for said polymer, about 0.001 to 1% by weight of a non-ionic fluorocarbon surfactant, and about 0 to 1% by weight of silane adhesion promoter, and curing material to form a polyimide seal coating.

* * * * *

UNITED STATES PATENT AND TRADEMARK OFFICE
CERTIFICATE OF CORRECTION

PATENT NO. : 4,238,528
DATED : December 9, 1980
INVENTOR(S) : Raymond W. Angelo et al.

It is certified that error appears in the above-identified patent and that said Letters Patent are hereby corrected as shown below:

| | |
|---|---|
| Column 3, line 15 | Change "P,P'-DIAMINOPHENYLMETHANE" to --P,P'-DIAMINODIPHENYLMETHANE--; |
| Column 3, line 57 | Change "ilustrates" to --illustrates--; |
| Column 8, line 33 | Change that part of the formula reading "$COR_3'$" to --$COR'_3$--; |
| Column 8, line 38 | Start a new paragraph after "group,". |

Signed and Sealed this

Seventeenth Day of November 1981

[SEAL]

Attest:

Attesting Officer

GERALD J. MOSSINGHOFF

Commissioner of Patents and Trademarks